(12) United States Patent
Durrill et al.

(10) Patent No.: US 7,168,041 B1
(45) Date of Patent: Jan. 23, 2007

(54) METHOD AND APPARATUS FOR TABLE AND HDL BASED DESIGN ENTRY

(75) Inventors: Steve Durrill, San Jose, CA (US); Vikas Kohli, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 442 days.

(21) Appl. No.: 10/170,078

(22) Filed: Jun. 10, 2002

(51) Int. Cl.
G06F 3/14 (2006.01)
G06F 17/50 (2006.01)

(52) U.S. Cl. .......................... 715/700; 715/509; 716/1
(58) Field of Classification Search .................... 716/1; 345/619; 715/503, 509, 526, 700
See application file for complete search history.

(56) References Cited

U.S. PATENT DOCUMENTS

| | | | | |
|---|---|---|---|---|
| 5,673,198 A | * | 9/1997 | Lawman et al. | 716/11 |
| 5,841,663 A | * | 11/1998 | Sharma et al. | 716/18 |
| 5,883,807 A | * | 3/1999 | Fanjoy | 716/8 |
| 6,529,913 B1 | * | 3/2003 | Doig et al. | 707/101 |
| 6,643,826 B2 | * | 11/2003 | Abe | 716/1 |
| 6,675,310 B1 | * | 1/2004 | Bloom et al. | 713/500 |
| 6,810,508 B1 | * | 10/2004 | Bloom et al. | 716/4 |
| 6,868,531 B1 | * | 3/2005 | Hovanetz | 716/1 |
| 2002/0104060 A1 | * | 8/2002 | Abe | 716/1 |
| 2002/0129334 A1 | * | 9/2002 | Dane et al. | 717/123 |

OTHER PUBLICATIONS

Mentor Graphics, "Designing ASICs with the ADK design kit and mentor graphics tools, Version 2.0", Mentor Graphics, Dec. 2001, pp. 1-93.*
http://www.prime-tec.com/hhm/screenshots.htm "HDL Hierarchy Manager Screenshots", 2000, pp. 1-7.*

* cited by examiner

*Primary Examiner*—Stacy A Whitmore
(74) *Attorney, Agent, or Firm*—John W. Carpenter; Reed Smith, LLP

(57) ABSTRACT

Views for signals and instances are provided in a table based design entry system. The signal view allows a designer to enter signals to be used in a design. The signals may be individually entered or imported from pre-defined or external packages of signals. The instance view allows the designer to enter components and to define connectivity of pins of the components to signals. The components may be entered individually or imported from predefined or external packages. An naming routines provides signal name generation and copying names of other components (e.g., pin names) to name the signals. Data entered into the table based entry system is checked for errors (duplicate names, syntax, etc.), and exported to other design tools for processes such as simulation, layout, etc.

14 Claims, 14 Drawing Sheets

FIG. 7A

| | Pin Name | Pin Number | Signal | Termination | |
|---|---|---|---|---|---|
| FILTER | * | * | * | * | |
| | BOOTSCC_100M_CLK | | | ... | ... |
| | AXSM_CLK_100 | | | ... | ... |
| | LOC_CNTL_TDO | | signal_0 | ... | ... |
| | LA_U2_ATM_ATMZR_CLK | | | ... | |

545 — Merge Vector Bits  Contact By:  534 — System Generated
532
740 — 742

FIG. 7B

| | Pin Name | Pin Number | Signal | Termination | Comments |
|---|---|---|---|---|---|
| FILTER | * | * | * | * | * |
| | BOOTSCC_100M_CLK | | | ... | ... |
| | AXSM_CLK_TDO | | | ... | ... |
| | LOC_CNTL_TDO | | signal_0 | ... | ... |
| | LA_U2_ATM_ATMZR_CLK | | | ... | ... |
| | DC_ATM_5OM_CLK1 | | DC_ATM_50M_CLK1 | ... | ... |
| | SFRAME_STATUS_CLEAR | | SFRAME_STATUS_ | ... | ... |
| | QE_NG_50M_CLK1 | | QE_ING_50M_CLK1 | ... | ... |
| | QE_NG_5CM_CLK15 | | QE_ING_50M_CLK15 | ... | ... |
| | CPU_MEM_100M_CLK2 | | | ... | |

545  550  534  536
Merge Vector Bits  Connect by  System Generated  Same As Pin Na
760  765  770

FIG. 7C

| | Pin Name | Pin Number | Signal | Termina |
|---|---|---|---|---|
| FILTER | * | * | * | * |
| | BOOTSCC_100M_CLK770 | | TEST | ... |
| | AXSM_CLK_100 | | TEST | ... |
| | LOC_CNTL_TDO | | RESET | ... |
| | LA_U2_ATM_ATMZR_CLK | | ADDR | ... |
| | DC_ATM_5OM_CLK1 | | CLK | ... |

700  715

| Instance View | Signal View | | | | | | |
|---|---|---|---|---|---|---|---|
| ⇒ Merge Vector Bits | Contact By: | | | ▶ ✱ System Generated | | ⇋ Same As Pin Name | |
| | Pin Name | Pin Number | Pin Type | Signal | Termination | Comments |
| FILTER | * | * | * | * | * | * |
| | HUMVE_ERR_ID* | | Unknown | | | |
| | LOWLINE* | | Unknown | | | |
| | ⊟ PCI_0_AD<31..0> | | Unknown | | | |
| | PCI_0_AD<31> | | | | | |
| | PCI_0_AD<30> | | | | | |
| | PCI_0_AD<29> | | | | | |
| | PCI_0_AD<28..5> | | | | | |
| | PCI_0_AD<4> | | | | | |
| | PCI_0_AD<3> | | | | | |
| | PCI_0_AD<2> | | | | | |
| | PCI_0_AD<1> | | | | | |
| | PCI_0_AD<0> | | | | | |
| | ⊞ PCI_0_CBE<3..0> | | Unknown | | | |

FIG. 7D

| | Signal Name | Physical Name | Signal Type | |
|---|---|---|---|---|
| FILTER | | | | |
| 1 | 3-3V | | Interface | |
| 2 | GND | | Interface | |
| 3 | VCC | | Interface | |
| 4 | ALT_ISP_TCK2 | | Global | |
| 5 | ALT_ISP_TMS2 | | Global | |
| 6 | ATM_DX_H2_CLK | | Global | |

Instance View / Signal View

| | Signal Name | Call | Instance | Pin Name |
|---|---|---|---|---|
| FILTER | * | * | * | * |
| | 3-3V | CAP | page2_48 | A |
| | 3-3V | MC100LVEL56 | page8_l14 | VCC1 |
| | 3-3V | MC100LVEL56 | page8_l14 | VCC0 |
| | 3-3V | CAP | page8_13 | A |
| | 3-3V | CAP | page8_13 | A |
| | 3-3V | CAP | page8_13 | A |
| | 3-3V | CAP | page8_13 | A |
| | 3-3V | CAP | page8_13 | A |
| | 3-3V | RES | page8_11 | B |
| | 3-3V | MC100LVELT22 | page8_10 | 3-3V |
| | 3-3V | RNWISO8 | page8_97 | A |
| | 3-3V | RNWISO8 | page8_97 | A |
| | 3-3V | RNWISO8 | page8_97 | A |

FIG. 9

METHOD AND APPARATUS FOR TABLE AND HDL BASED DESIGN ENTRY

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of Invention

The present invention relates to electronic circuit designs, and amongst other things to a method and apparatus for entering, saving, sharing, and displaying connections in an electronic design. The invention also relates to entry and display of connections in any type of network.

The invention can also be leveraged in a large pin-count Integrated Circuit Package design where the connectivity from the die to the package is defined.

2. Discussion of Background

Modern circuit design, particularly board-level digital designs, is not as efficient as it was when schematic capture techniques were first utilized. Designs once consisted of many small and medium pin-count devices with an occasional large FPGA, MCM, or connector. For small and medium pin-count devices one schematic symbol has sufficient space for identifying all pins and signals associated with the device and it could be easily placed on an A or B size page. However, modern designs are increasing in complexity and decreasing in the number of components on the board being designed. The increased complexity is realized in the size of the ICs, FPGAs, ASICs, and other large components now placed on the board. Large components with hundreds, or even a thousand or more pins is not uncommon. Therefore, as the complexity of the component increases along with increased pin counts, there is also a corresponding increase in the complexity of the logical interconnects between the components and other components/devices on the board.

As a result, using traditional schematic design approaches, a large majority of schematics have become little more than many large rectangular schematic symbols with pin stubs and signal names attached (one block with wires and signal names attached to it). In the larger designs (e.g., a 1,000 pin FPGA) is so large that the single device will not fit on a standard sized schematic page. To get around this problem, using current schematic techniques, the larger devices are split into multiple parts of a schematic symbol, the multiple parts are then individually placed on multiple sheets of schematic drawings.

Furthermore, as large pin count devices become more prevalent in designs, there is a need to be able to connect these up quickly. And, instantiating these in schematics has following additional pitfalls:

Schematic symbol creation is often needed, particularly for large pin-count devices. Even though library tools are becoming more and more mature in their abilities to import XML, apply symbol templates and create multiple symbols, the process is not always usable for a specific device or component (particularly newly developed components). Some devices simply do not have XML or other import representations.

Symbol graphics do not necessarily represent the logical function of a device. The symbol has to be split into multiple symbols because it is too big to fit on a single schematic sheet. Some users spend great amounts of time documenting the function of a device by annotating graphics inside the device boundary. This is extremely time consuming and not always an effective way of describing the logical intent.

Large symbol instances leave little room for logical wiring. This means that all connections are formed via signal names. This is an error-prone process and is time-consuming to capture.

Designers have entered their connectivity in Verilog™ and have written custom parsers to parse these files and create connectivity files for layout tools. However, entering connectivity in Verilog™ is also error prone as the user enters all pin names manually and then enters the signal names. With large FPGAs or other ICs, the chances for error are significant. Furthermore, there are difficulties for user attempting to see his/her packaging information, like reference designators and pin numbers, in the Verilog™ text file. Adding constraints and properties is difficult, and nearly impossible in a standard text editor.

Unfortunately, the available techniques only reduce traditional design to a connect-by-name process instead of connect by logical wire. And again, very few of the symbol's graphics indicate any logical meaning, which makes it more difficult for a designer to capture the larger picture of what the design is intended to produce. This is quite different than what the schematic illustrations are able to convey when entire symbols, and, in fact, entire designs were placed on a single, or a relatively small number, of schematic sheets. When able to "see" more of the entire design, the designer has a better understanding of the goals of the design and can more quickly decide what modifications/improvements are needed to complete or improve a particular design. Therefore, designer productivity and quality improvements can be made if tools are available that allow designers to more easily capture and then comprehend and understand the myriad of connections required in modern circuit designs.

SUMMARY OF THE INVENTION

The present inventors have realized that designs dominated by large pin-count devices are in need of a more efficient way of capturing interconnect between components of the designs. The present invention provides a table based method for entering, displaying, and sharing electronic designs. The table based entry system is based on a connectivity paradigm and provides the designer with the ability of entering connectivity based on pins or nets rather than relying on schematic illustration for connections and signal naming. The present invention also provides the designer with the ability to see packaging details of a design along with connectivity. Here packaging details includes assigning reference designators and pin numbers to instances, including combining instances into one or more multi-slot packages.

In one embodiment, the present invention provides a system for design entry, comprising, a signal entry device configured to accept data of a design, said data comprising signals and at least one of parameters and connectivity of the signals, and a graphical interface device configured to display the signals and data in a selected one of a signal view comprising a list of the entered signals, and a signal connectivity view comprising a list of connections to a selected signal.

In another embodiment, the present invention provides a system for design entry, comprising, a component entry device configured to enter data of components to be used in the design, and a graphical interface device configured to display the components and a detail of a selected one of the displayed components, wherein said component data includes a name of a component being entered, pins of the component being entered, and connectivity of the pins and their pin numbers.

In yet another embodiment, the present invention provides a system for design entry, comprising, a component entry device configured to enter data defining at least one component and data to be used in the design, a graphical interface device configured to display the components and data of the design, and a naming function configured to determine and assign a name for at least one piece of data of the design.

The present invention includes a method of design entry, comprising the steps of displaying a signal view comprising a listing of signal identifier locations and at least one parameter location for each signal identifier location, retrieving inputs, including at least one of signal identifiers and parameters for signals identified by the signal identifiers, displaying the input signal identifiers and parameters in corresponding signal identifier and parameter locations of the signal view, and displaying connectivity of a signal selected in the signal view.

The present invention may also be embodied as a method, comprising the steps of, displaying an instance view comprising a listing of component locations configured to display names of components, retrieving component inputs, including at least one of component identifiers and parameters for components identified by the component identifier, displaying the input component identifiers and parameters in corresponding component and parameter locations of the instance view, and displaying connectivity of component selected in said instance view in a detailed view comprising pin names of the selected component and signal name associated with each pin.

Other than the summary structural descriptions of the invention noted above, the present invention may also be described in various means plus function implementations. For example, the present invention may be broadly described as a device for design entry, comprising, means for accepting data of a design, said data comprising signals and at least one of parameters and connectivity of the signals, and means for displaying the signals and data in a selected one of a signal view comprising a list of the entered signals, and a signal connectivity view comprising a list of connections to a selected signal.

Portions of both the system and/or devices, and methods of the present invention may be conveniently implemented in programming on a general purpose computer, or networked computers, and the results may be displayed on an output device connected to any of the general purpose, networked computers, or transmitted to a remote device for output or display. In addition, any components of the present invention represented in a computer program, data sequences, and/or control signals may be stored as a set of instructions stored on a computer readable media and/or embodied as an electronic signal broadcast (or transmitted) at any frequency in any medium including, but not limited to, wireless broadcasts, and transmissions over copper wire(s), fiber optic cable(s), and co-ax cable(s), etc.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7A is a screen shot of a user interface used by an system generated signal name process according to an embodiment of the present invention;

FIG. 7B is a screen shot of a user interface used by a "same as pin name" naming process according to an embodiment of the present invention;

FIG. 7C is a screen shot of a user interface used by a signal name process according to an embodiment of the present invention;

FIG. 7D is a screen shot of a user interface illustrating pin names and corresponding data in tabular format according to an embodiment of the present invention;

FIG. 9 is a screen shot of a user interface used by a signal view process according to an embodiment of the present invention;

DESCRIPTION OF THE PREFERRED EMBODIMENTS

Figure 1:
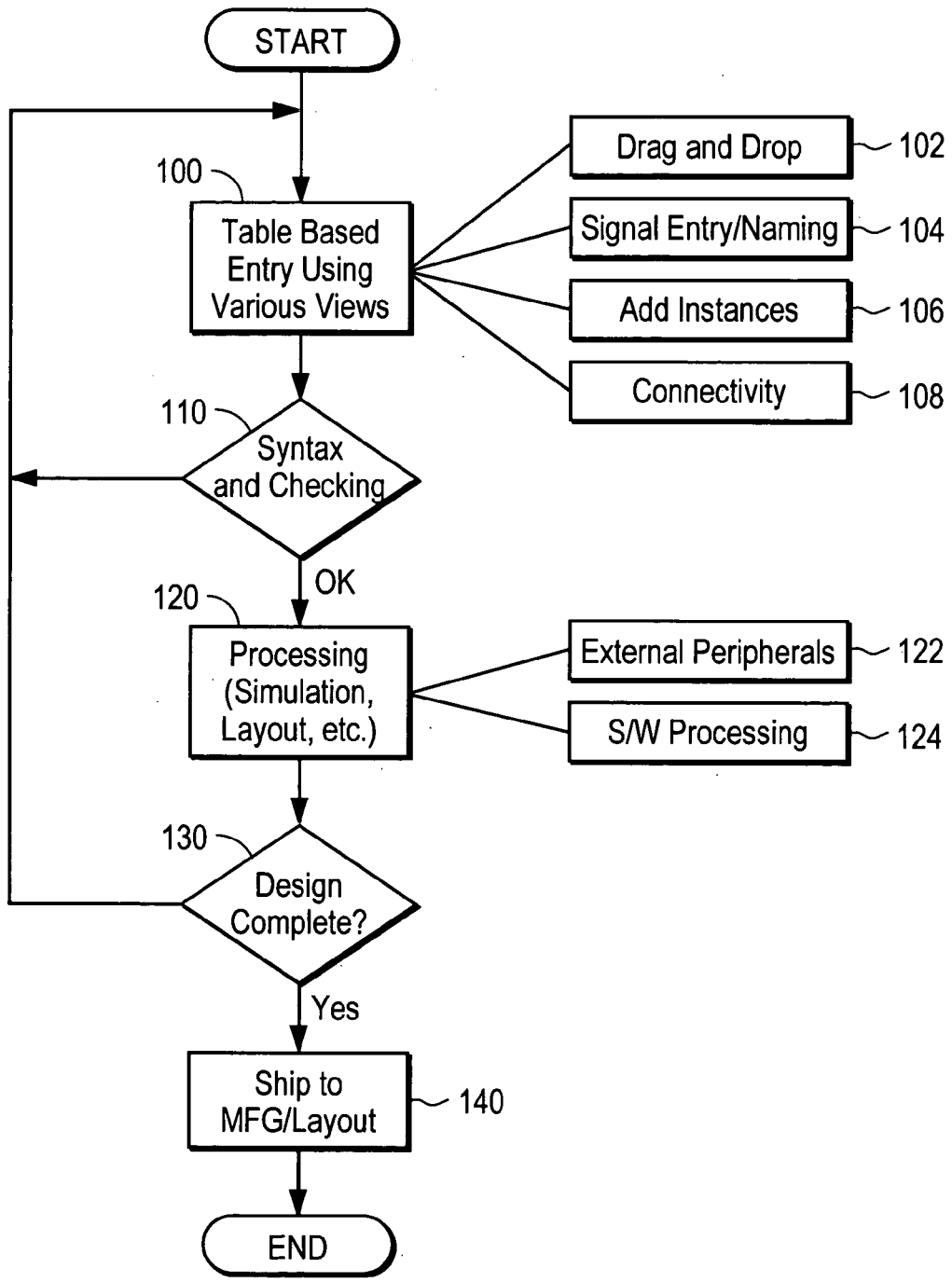
FIG. 1 is a flow chart of a high level process according to an embodiment of the present invention.

Currently, board and electronic system designers are using schematic diagrams to identify pins and signals paths (signal names) attached to the identified pins. However, as noted above, with decreased component counts and increased pin counts of modern designs, the schematic representations of a design are not very meaningful to the designer, particularly when trying to look at overall features of a design, investigate a signal path, or evaluate other features of a design. This is mainly due to the fact that large pin count component needs to be split between multiple schematic symbols (or parts of a single symbol). Once the schematic is drawn, the pins are labeled, wires are attached to each pin, and signal names are assigned to each wire. However, such a technique adds little value to the designer because nothing more than a set of pins and signal names are shown, and very little, if anything, can be deduced about the overall design or a particular signal path by viewing the schematic.

One way that designers are currently using to work around the problems caused by large pin count components begins by entering their designs into the Verilog™ language. The Verilog™ implemented design is then post-processed by various tools, and then eventually provided to layout. However, Verilog™ itself is not the ideal solution as it does not overcome all of the problems associated with the large pin count devices of modern designs. For example, Verilog™ generally requires entry of all pin names manually by the designer. Entering 1000 or more pin names is not only a difficult procedure, it also makes for a high probability of human error, from typos or other mistakes. Even if a file exists that can be read or copy/pasted from, that file needs to have all pin names manually entered at some point. Other common mistakes include accidentally deleting portions of pin names or entire pin names when copy/pasting or otherwise editing a pin name file or Verilog™ design. All of these problems significantly reduce designer productivity.

A single error prevented early in a design yields many hours of saved troubleshooting and re-engineering that becomes more difficult and costly as the design progresses. Furthermore, for the reasons noted above, redesign issues that do come up during development are made even more difficult by the fact that these modern designs are mainly on large pin count devices in which the schematic illustrations do not allow the designer to easily investigate specific signal paths of interest.

The present invention provides a table based method for entering, displaying, and sharing electronic designs. A feature of the present invention is that it makes it convenient for a designer to enter his/her design. Typically, designers begin a design by taking a main component, labeling the pins and naming all of the critical signals connected to those pins. Other signals (non-critical) may be left unnamed because the designer is not concerned with those signals any substantial reasons (other than perhaps electrical connectivity). Table based entry according to the present invention provides two primary methods for entering a design, including: 1) a signal view, and 2) an instance view.

Signal view is a table based entry/editing system that allows the user (designer user) to enter a list of signal names that the user wants to use in his/her design. The Signal view also provides a list of signals and information about the signal in a tabular, spreadsheet style, listing. Instance view is a table based entry/editing system that provides a list of components and information about the components in a tabular, spreadsheet style listing. Preferably, the information includes component pins and signals associated with the pins. The instance view also allows the user to enter the components that the user wants to use in the design. Both the signal view and the instance view contain similar data viewed differently. The data of the views is therefore maintained in a common database. The database of entered information is linked in a manner such that editing in one view makes corresponding changes in the other view.

Thus, the designer (user) is provided with a table entry system based on a connectivity paradigm and provides the designer with the ability of entering connectivity based on pins or nets rather than relying on schematic illustration for connections and signal naming.

Referring now to the drawings, wherein like reference numerals designate identical or corresponding parts, and more particularly to FIG. 1 thereof, there is illustrated a high level design process according to an embodiment of the present invention. The design process begins by entry of the basic design parameters using the table based entry system (step 100). The table based entry system utilizes a number of features for entering designs. For existing components, a drag & drop method that pulls components from, for example, an component icon list or component file list (sub step 102). The drag and drop component, is for example, a file that contains a component name and all the pin names of a component.

Table 1 provides an example of a component file.

TABLE 1 module backplane_int_block (\a_bus* , \bc_bot_inserted_bot* ,
\bc_bot_inserted_top* ,
    bc_bot_nvram_clk, bc_bot_nvram_cs, bc_bot_nvram_d_i,
    bc_bot_nvram_d_o, \bc_top_inserted_bot* ,
    \bc_top_inserted_top* , bc_top_nvram_clk,
    bc_top_nvram_cs, bc_top_nvram_d_i,
    bc_top_nvram_d_o, \b_bus* , \card_ready* ,
    \cback_a* , \cback_b* , cbclk_a, cbclk_b, cbgrnt_a,
    cbgrnt_b, cbpoll_a, cbpoll_b, cbreset_a, cbreset_b,
    cbrx_a, cbrx_b, cbtxfrm_a, cbtxfrm_b, cbtx_a,
    cbtx_b, dc_1944m, dc_48k, dc_8k,
    \fc_bot_inserted* , \fc_remote_inserted* ,
    \fc_top_inserted* , grntena_a, grntena_b, m48vde, slot_id,
    smclk_pri, smclk_sec, sm_card_reset, sysclk_marg_clk,
    \sysclk_marg_sel* , utopia_marg_clk, \utopiamarg_sel* );
input bc_top_nvram_d_i;
input bc_top_nvram_clk;
input bc_top_nvram_cs;
input bc_bot_nvram_d_i;
input bc_bot nvram_clk;
input bc_bot_nvram_cs;
input \card_ready* ;
input [8:0] cbrx_a;
input cbpoll_a;
input \cback_a* ;
input [8:0] ebrx_b;
input cbpoll_b;
input \cback_b* ;
input smclk_pri;
input smclk_sec;
output m48vdc;
output \fc_top_inserted* ;
output \fc_bot_inserted* ;
output \bc_top_inserted_top* ;
output \bc_top_inserted_bot* ;
output \bc_bot_inserted_top* ;
output \bc_bot_inserted_bot* ;
output \fc_remote_inserted* ;
output \utopia_marg_sel* ;
output utopia_marg_clk;
output \sysclk_marg_sel* ;
output sysclk_marg_clk;
output bc_top_nvram_d_o;
output bc_bot_nvram_d_o;
output dc_1944m;
output dc_48k;
output dc_8k;
output [3:0] slot_id;
output sm_card_reset;
output \a_bus* ;
output \b_bus* ;
output [8:0] cbtx_a;
output [3:0] ebgrnt_a;
output cbtxtrm_a;
output cbreset_a;
output grntena_a;
output cbclk_a;
output [8:0] cbtx_b;
output [3:0] cbgrnt_b;
output cbtxfrm_b;
output cbreset_b;

TABLE 1-continued

```
    output grntena_b;
    output cbclk_b;
endmodule
```

The example component file in Table 1 is for a Verilog™ definition. The component file may also be a VHDL definition, or other definition files having a different syntax. The component file may also be a logical to physical pin mapping file that is used to generate a netlist for layout. An example of this file is illustrated in Table 2 below:

TABLE 2

```
FILE_TYPE=LIBRARY_PARTS;
primitive 'DAC0800';
    pin
        'V+':
            PIN_NUMBER='(1)';
            INPUT_LOAD='(-0.01, 0.01)';
        'VREF1':
            PIN_NUMBER='(2)';
            INPUT_LOAD='(-0.01, 0.01)';
        'VREF2':
            PIN_NUMBER='(3)';
            INPUT_LOAD='(-0.01, 0.01)';
        'COMP':
            PIN_NUMBER='(4)';
            INPUT_LOAD='(-0.01, 0.01)';
        'TCTRL':
            PIN_NUMBER='(5)';
            INPUT_LOAD='(-0.01, 0.01)';
        'IOUT':
            PIN_NUMBER='(6)';
            INPUT_LOAD='(-0.01, 0.01)';
        'V-':
            PIN_NUMBER='(7)';
            INPUT_LOAD='(-0.01, 0.01)';
        'IOUT':
            PIN_NUMBER='(8)';
            INPUT_LOAD='(-0.01, 0.01)';
        'B'<8>:
            PIN_NUMBER='(16)';
            OUTPUT_LOAD='(1.0, -1.0)';
            OUTPUT_TYPE='(TS, TS)';
        'B'<7>:
            PIN_NUMBER='(15)';
            OUTPUT_LOAD='(1.0, -1.0)';
            OUTPUT_TYPE='(TS, TS)';
        'B'<6>:
            PIN_NUMBER='(14)';
            OUTPUT_LOAD='(1.0, -1.0)';
            OUTPUT_TYPE='(TS, TS)';
        'B'<5>:
            PIN_NUMBER='(13)';
            OUTPUT_LOAD='(1.0, -1.0)';
            OUTPUT_TYPE='(TS, TS)';
        'B'<4>:
            PIN_NUMBER='(12)';
            OUTPUT_LOAD='(1.0, -1.0)';
            OUTPUT_TYPE='(TS, TS)';
        'B'<3>:
            PIN_NUMBER='(11)';
            OUTPUT_LOAD='(1.0, -1.0)';
            OUTPUT_TYPE='(TS, TS)';
        'B'<2>:
            PIN_NUMBER='(10)';
            OUTPUT_LOAD='(1.0, -1.0)';
            OUTPUT_TYPE='(TS, TS)';
        'B'<1>:
            PIN_NUMBER='(9)';
            OUTPUT_LOAD='(1.0, -1.0)';
            OUTPUT_TYPE='(TS, TS)';
    end_pin;
    body
        JEDEC_TYPE='SOIC16';
        CLASS='IC';
```

TABLE 2-continued

```
        end_body;
    end_primitive;
END.
```

The designer may also drag and drop (or browse and select) a file containing pre-defined signal names (sub-step 102). Alternatively, the designer adds signals by entering the names one or more of the signals. Instances of components utilized in the design are also entered (sub-step 106) and signals are associated with one or more pins of the added components.

The association of signal names to pins is in a tabular format that is displayed to the user to allow the user to quickly identify the component, the pins of the component, and the signals associated with the component. The present invention provides multiple ways in which to add signal names, components (sub-step 104), and make the association between pins and signals as required by the design (sub-step 108).

Once the design is entered, syntax of the entered signals and other checks, like port and signal width mismatch, are performed (step 110). In one embodiment, syntax is checked at each step of design entry. If syntactical problems or other issues are raised by the checks, a short error message describing the problem (and suggested corrective action) is displayed in a error window, or via a pop-up menu/notice.

After any syntax or other error checks, the design is forwarded for simulation and processing by other tools (step 120). Simulation and processing may be performed by software resident on a same platform that hosts the table based entry system (sub-step 124), or may be shipped to external peripherals or other devices (sub-step 122).

If the design is complete (step 130), then the design is shipped to manufacturing or layout (step 140). At any point in the design process (e.g., syntax checking 110, or design complete 130), if needed, the table based entry system 100 is available to edit or add additional connectivity and components to the design.

Figure 2:
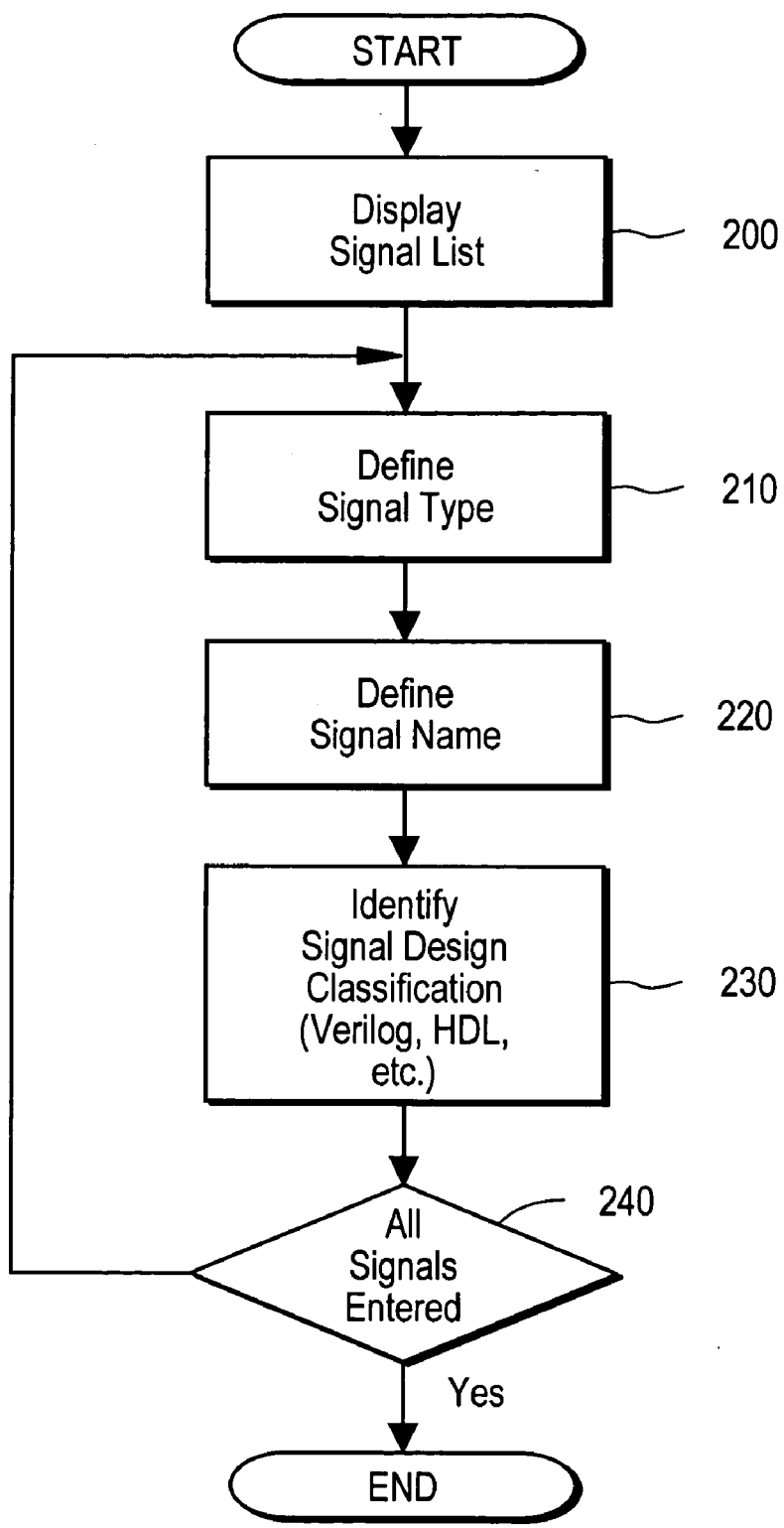
FIG. 2 is a flow chart of a signal definition process according to an embodiment of the present invention.

Now, looking closer at the table based entry system, FIG. 2 is a flow chart of a signal definition process according to an embodiment of the present invention. The signal definition process illustrates example processing for capture of design information in the signal view of the present invention. At step 200, a list of currently existing signals is displayed in a tabular format. If the design is completely new, then the signal list will be empty. At increasing stages of design development, more signals will be added to the list and some of the added signals may be deleted depending upon how the design evolves.

Figure 3:
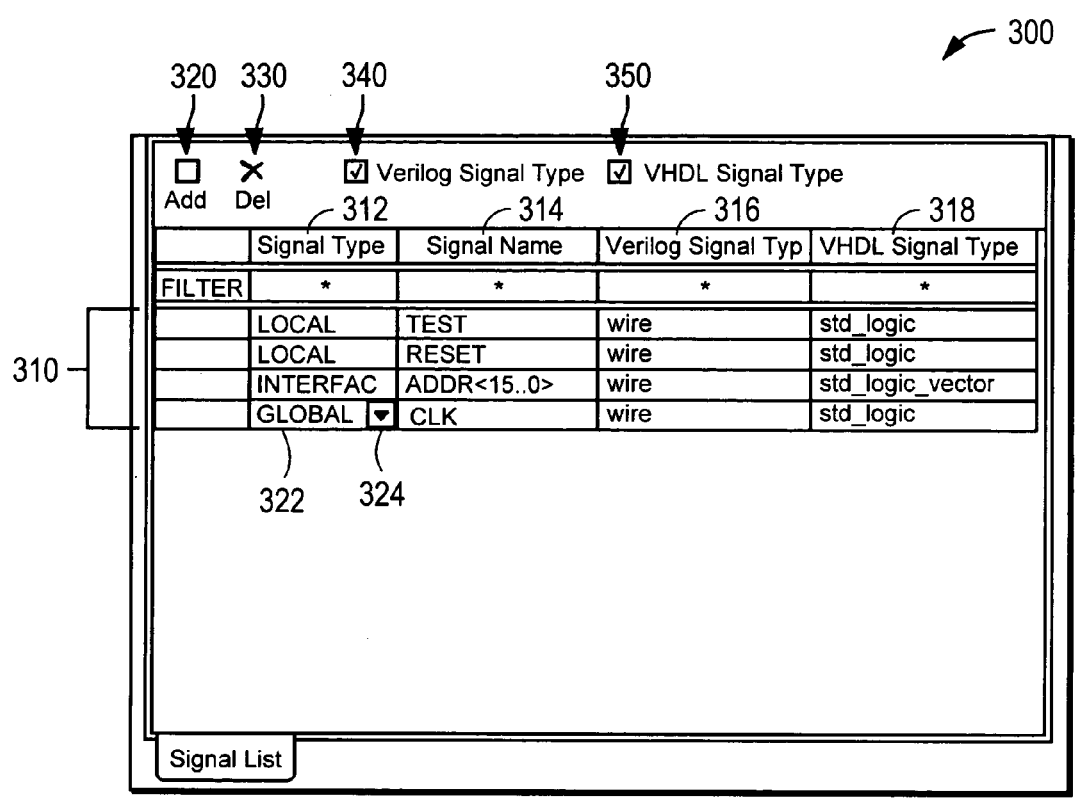
FIG. 3 is a screen shot of a user interface used by a signal definition process according to an embodiment of the present invention.

FIG. 3 is a screen shot 300 of an example user interface used by a signal definition process according to an embodiment of the present invention. The screen shot 300 illustrates facilities used by the present invention to retrieve signals entered by a user (or imported from a file), and display the entered signals and various parameters (characteristics) of the entered signals. Currently entered signals are displayed in rows 310. Each of the currently entered signals has characteristics or parameters that are listed in each of columns 312 . . . 318. The parameters include, for example, Signal Type, Signal Name, Verilog™ Signal Type, and VHDL Signal Type. The signal parameters shown are exemplary in nature and any other characteristics or parameters of the signals may also be entered and displayed, depending on implementation specific details. Table 3 provides an example list of signal parameters and characteristics that may be utilized in one or more embodiments of the present invention:

TABLE 3

| Signal Type | Domain of the signal (e.g., Global, Local, Interface. |
|---|---|
| Signal Name | Assigned Name of the Signal |
| Verilog ™ Signal Type | Verilog ™ equivalent signal type |
| VHDL Signal Type | VHDL equivalent signal type |

Continuing now with the flow chart of FIG. 2, after the currently entered signals are displayed (step 200), a user inputs any new signals for the design being created. Signal entry comprises identifying the signal and providing the parameters and characteristics of the signal. For example, at step 210, the signal type is entered.

Various mechanisms are envisioned that allow a designer to enter signals. For example, one method of entering the signal type is shown in FIG. 3. By clicking on an add icon 320 (which may be embodied as a drop down list, button, icon, or other selection mechanism) a new row is added to the signal view. By clicking on the cell of the new row in the Signal Type column 312, a drop down box is provided with a set of previously defined signal types. Signals already placed in the signal view may be updated or modified using a similar technique (clicking on the signal type column of the signal to modify, and using the drop down box to select an updated signal type). In the example of FIG. 3, a pre-existing signal CLK has been clicked on in the Signal Type column (ref no. 322). The Signal Type value GLOBAL is highlighted, and a drop down menu indicator 324 is available for selection of alternative signal types.

Other mechanisms, such as a set up screen, allow a user to set-up the table based entry system with a set of pre-defined selections for Signal Type to be displayed in the drop down window 324. A predefined range of values may be selected from pre-defined packages, or imported from external files, or a user may define specialized or custom signals not available in a pre-packaged set. Other parameters/characteristics of each signal may be similarly displayed and chosen via drop down selection boxes in the cell corresponding to the signal and characteristic.

The Signal Types available in this example provide selection of Local, Global, and Interface as the operative domain of the identified signal. In one embodiment, the local signals are only visible to the current user or design module. An interface signal identifies a signal that relies on connectivity to another part of the design (e.g., an outside device, or a remote component). And, a global signal is intended to be visible and modifiable to anyone who has access to other parts of the design. Other restrictions and/or permissions may also be placed on whether users have access to use or to modify particular signals. The various signal types and access/permission levels are also made user modifiable via a set-up screen or other mechanisms.

In the collaborative aspect of the design it is preferable to define ownership of blocks and signal names. The ownership characteristics will define how the design modules are pulled together to form the final product. Preferably, each engineer on the product will own blocks of the design. They are responsible for editing and constraining their blocks and signals. At the integration point the team leader will pull the design together for physical netlisting. Therefore, for signal names, only the owner of a particular signal name can change the type.

At step 220, the signal name is entered. Referring again to FIG. 3, the Signal Name is entered in column 314 at the row corresponding to the previously entered signal type. The signal name may be included in any files or pre-packaged signals read in, or the signal name may be entered manually by the designer by clicking on the appropriate cell of the table and typing the name in. The order in which the signal parameters and signal name are entered may be changed, the important aspect of signal entry is that all needed relevant information be entered and then displayed in the signal view tabular format that is linked to the other views of the design (e.g., instance view).

Preferably, the present invention is sensitive to preferences of current design techniques. Also entered into the signal view is Verilog™ and VHDL signal information (step 230). Check boxes 340 and 350 are provided to identify signals having a Verilog™ and/or a VHDL equivalent signal type.

At step 230, other parameters of the signal are also entered into the signal view 300. In this example, parameters identifying Verilog™ Signal Type and VHDL Signal Type are entered. Example Verilog™ Signal Types include wire, tri, tri1, supply0, wand, triand, tri0, supply1, wor, trior, trireg, and reg. Example VHDL Signal Types include std_logic, std_logic_vector, etc. Example VHDL signal types include std_logic, std_ulogic, std_logic_vector, std_u-logic_vector. And, the designer/user can also add his own defined types if he has defined them in a configuration file.

When a signal name is entered the invention uses the name to pick the appropriate type for VHDL (e.g., if user enters test it will default to std_logic but if user enters ADDR<15 . . . 0> it will default to std_logic_vector). Similar programming is possible for all signal types.

The check boxes 340 and 350 of FIG. 3 illustrate one method of identifying if a signal has a corresponding Verilog™ and/or VHDL equivalent signal types. If Check box 340 is selected then the Verilog™ signal of a new signal is automatically filled in signal is entered. Similarly for, check box 350 the VHDL signal type is automatically filled in when new signal is added. When manually entering signals for the first time, the user selects the appropriate check boxes and the information identifying Verilog™ and VHDL equivalent signal types is saved with the newly entered signal. When signal types are read in from a file of pre-defined signal types, information regarding the corresponding Verilog™ and VHDL signal types is included in the predefined signal type file. If an existing signal needs to be updated the user selects the signal and manually updates the signals. Update information may also be provided in an update file that is read in to the signal view table.

Updates may also include deletion of previously entered signal. To manually delete a signal, the user selects the signal to be deleted and then clicks on the delete icon 330. Again, although the presently described user interface is preferred, any number of user interface icons, listboxes, selection/modification mechanisms, and/or display methodologies may be envisioned based the present disclosure, and it would be impossible for the present inventors to list all possible alternatives. Therefore, it should be understood for the signal list view 300 here, as well as other user interfaces described herein, that the invention may be practiced other than as specifically described herein and still not depart from the spirit or scope of the present invention.

The signal view list provides an overall look at a system being designed from a signal point of view. The present invention also provides facilities to view the design from an instance view. The instance view provides a list of components in the design. Each component is selectable, and when selected, the selected component's pin names are also displayed along with signals assigned to the pins. Among other features, by utilizing instance view, a designer can add or delete components of a design, identify or modify pins of components in the design, and assign or modify signals associated with one or more pins of components in the design.

Figure 4:
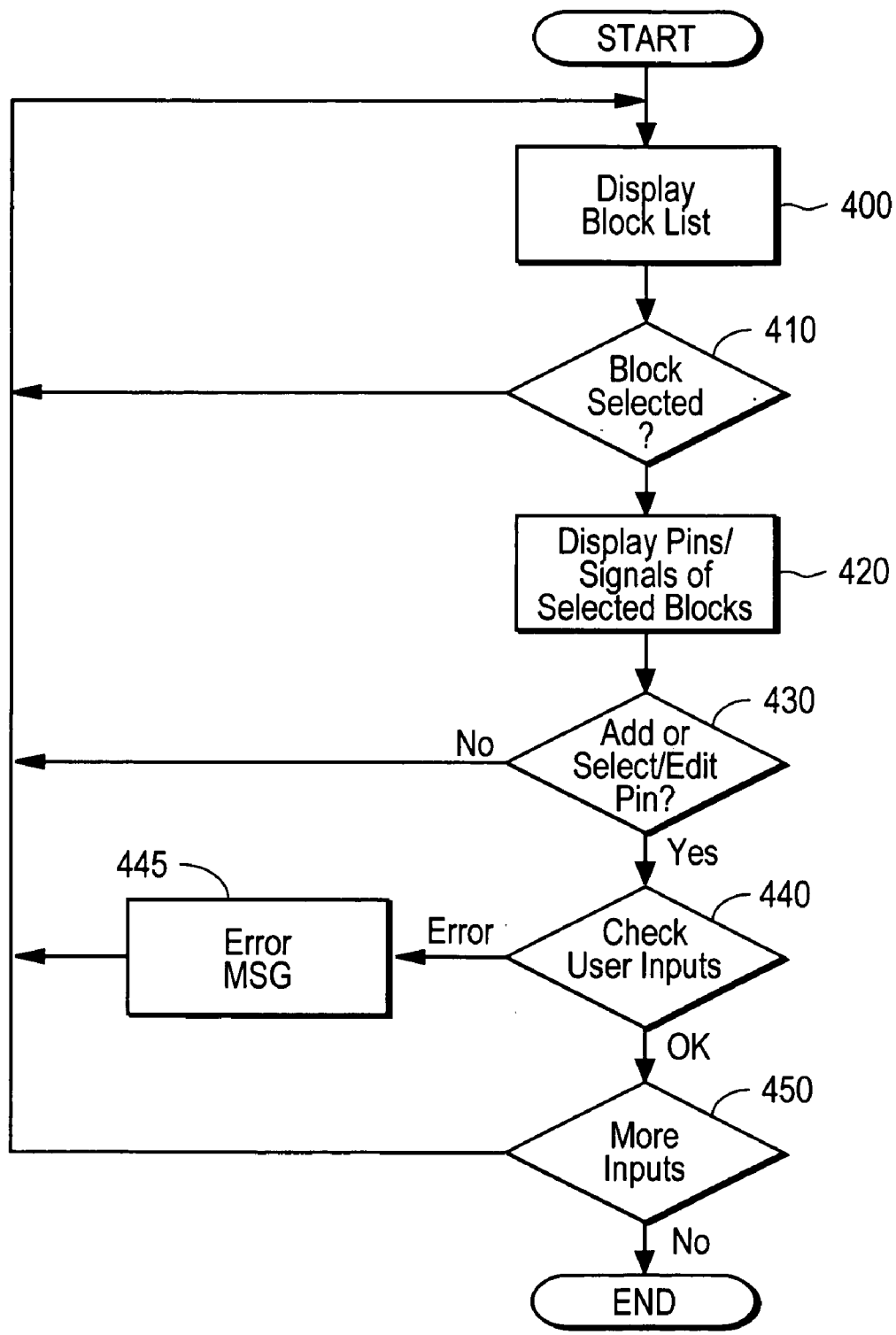
FIG. 4 is a flow chart of an instance view connectivity process according to an embodiment of the present invention.

FIG. 4 is a flow chart of an instance view connectivity process according to an embodiment of the present invention. At step 400, a list of blocks (or components) currently in the design is displayed. If the design is completely new, the block list will be empty. If the design has one or more components already entered, the components will be displayed. A block is normally a sub-design while a component is a primitive (i.e., maps directly to a physical device 0. A logical design is comprised of primitives that represent a physical device on the board, and hierarchical blocks that represent logical sub-designs. The main difference in the user interface is that a logical sub-design defines further connectivity where a primitive only contains the interconnect to its ports.

Figure 5:
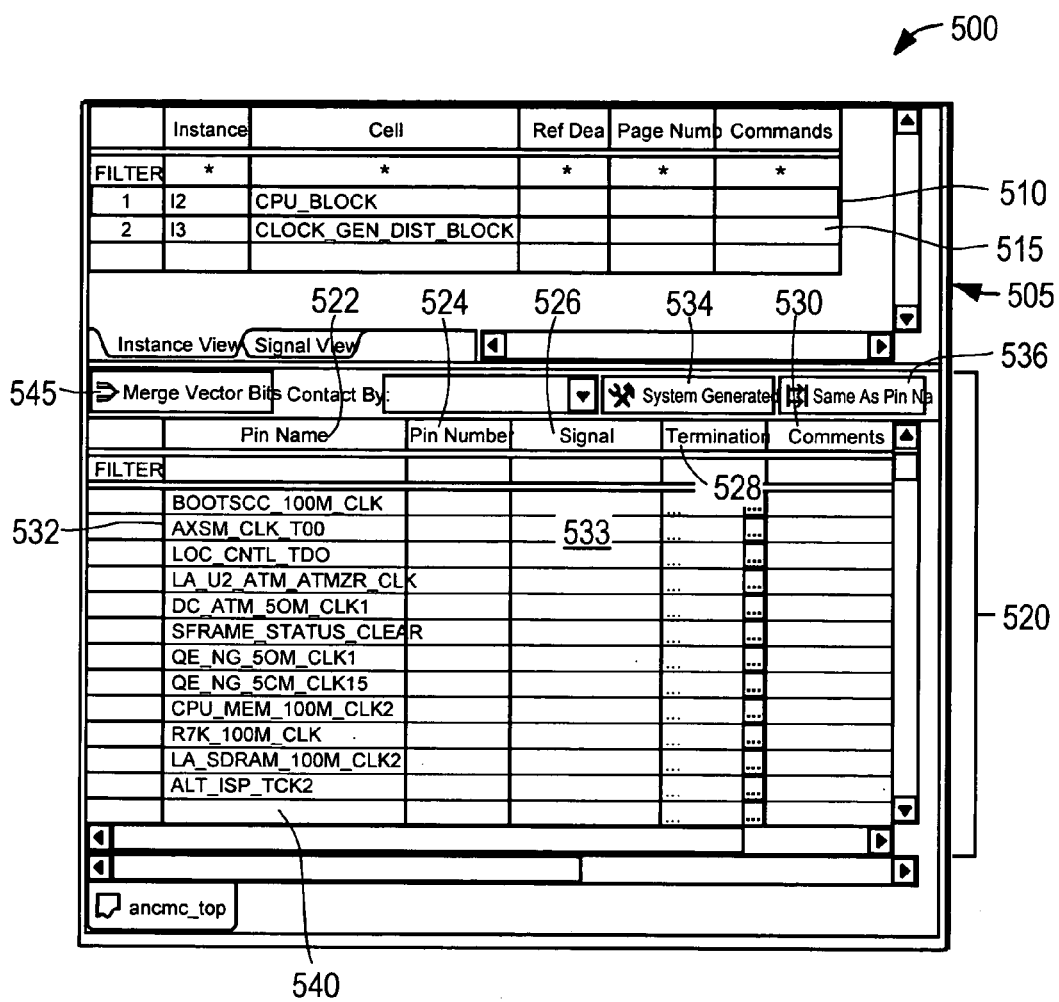
FIG. 5 is a screen shot of a user interface used by an instance view and connectivity process according to an embodiment of the present invention.

FIG. 5 is a screen shot 500 of a user interface used by an instance view and a connectivity process according to an embodiment of the present invention. In FIG. 5, an example design is displayed in a tabular format and having 2 components entered into the design, a CPU_Block 510 and a CLOCK_GEN$_{DIST}$_BLOCK 515.

Continuing with FIG. 4, at step 410, if a block/component is selected, then the pins and signals assigned to the block are displayed (step 420). In FIG. 5, the CPU_Block 510 is shown as selected. In a detail area 520, the pins and assigned signals of each pin of the CPU-BLOCK 510 are displayed in a tabular format. The detail area 520 includes a row for each pin name, each row segmented into different characteristics, or parameters of the pin, including, pin name 522, Pin Number 524, Signal Name 526, Termination 528, and Comments 530. If the block was previously entered, or read in from a predefined block package or file having pin information contained therein, then, all of the pin names and information about the pins previously entered or from the file is included and displayed in the detail area 520. If the block is a newly entered block without a block file, then the user will need to enter the pins of the block and the information (characteristics and parameters) for each pin.

The present invention has facilities to allow a designer to take advantage of previously defined blocks by identifying a file or other package that contains file and reading it into the design being worked on. The present invention also has facilities for saving defined blocks that can then be re-used in subsequent designs. For example, consider the designer who completes entering all the pin names and other information for the CPU_BLOCK 510. When the user saves the design the CPU-BLOCK 510 will automatically be saved. The block is then available for use in future designs.

In one alternative, by selecting a pull down menu item (or other button, tag, etc.) the designer invokes a save block routine. The block is then saved as a file that can be read in and used in later designs. The save block menu may include other options, such as check boxes for each of the columns of the detail area 520, giving the designer the option of saving or not saving any one or more of the parameters or information about the pins in the file.

Table 4 provides definitions for the pin information contained in detail area 520. Any other information about the pins may be contained in the comments column, or, in other embodiments, other information items may be assigned their own separate column.

TABLE 4

| | |
|---|---|
| Pin Name | Name of the pin (assigned by the block designer, or component manufacturer) |
| Pin Number | Number identifying the pin (e.g., datasheet pin identifier) |
| Signal | Signal name connected to the pin |
| Termination | identifies how the pin is terminated (if any). |
| Comments | Any designer comments or notes |
| Pin Type | Type of pin - input/output/inout |

Now, in the case where the design is new, or the block being entered has not been previously entered or read from a file, then the designer enters the pin names and other information about the block in the detail area 520. Along with several unique entry techniques, entering the block information shares some common ground with entering signal names and parameters in the signal view described above. To add a pin, the user would invoke a new pin button, drop down window, right mouse click menu selection, or other mechanism (not shown for clarity) to add a row in the detail area 520. Adding and editing pins applies to blocks (e.g., pins are added or deleted to/from a block or component of the design, and editing also applies to pins of a block/component). Alternatively, if the pins are already entered, the user selects a pin to add signal names or otherwise update the design (step 430) (e.g., edit pins or pin connectivity). With the newly added or selected pin, the user then clicks (mouse click) in the cell in which the user wants to add or modify information. For example, a pin named AXSM_CLK_TDO 532 is selected (or a new row is added and a name entered), and the user then enters a new or corrected Signal Name into cell 533 (a new signal name in this example).

The present invention includes an Auto Name class of functions that is particularly useful for naming signals or other features of a design. The Auto Name class of functions includes, for example, a system generated naming process, a same as pin name process, and a paste special process. A System Generated button 534 is used to invoke an the system generated naming process that creates a unique name for the part or feature being named. For example, to system generate a signal connected to a pin, the user selects the signal cell of the pin name (e.g., pin name cell 540) and presses the System Generated button 534. The system generated naming process then generates a unique name and fills in the cell. System Generated can be used for naming new pins, signals, or other parts, or for renaming existing pins, signals, or other parts. In one embodiment, the system generated naming process uses a descriptor of the part being named and a sequentially generated index (e.g., pin_idx, or pin_001, pin_002, . . . , for pin names; and sig_001, sig_002, . . . , etc., for signal names). However, in the preferred embodiment, the system generated naming process is specifically utilized for signal names, and selecting a pin name and clicking System Generated fills in the signal name column for the selected pin name row with the system generated signal name.

The "Same As Pin Name" process is invoked, for example, by button 536. The "Same As Pin Name" process saves designer time and effort in preparing and entering a name for the signal attached to that pin, by preparing a name that is similar to the pin name for use in naming other parts, such as signals, of the design. For example, the AXSM_CLK_TDO signal is an Axi-symmetric Clock produced by the CPU_BLOCK. The pin name AXSM_CLK_TDO 532 is descriptive of the signal the block produces on that pin and therefore also makes an ideal name for the signal. The "Same As Pin Name" button 536 invokes the "Same As Pin Name" routine that prepares a name based on the pin name. In one embodiment, the "Same As Pin Name" routine copies the pin name making it exactly the same name as the item to which the auto name routine is being applied (e.g., the signal name attached to the pin). In another embodiment, the "Same As Pin Name" routine uses a predetermined number of characters from the Pin Name and then adds an identifier (e.g., a prefix "sig_," or an index "_idx" in which the index changes each time the auto name routine is invoked) to the pin name to create the name for the item the "Same As Pin Name" routine is being applied. Preferably, the "Same As Pin Name" routine is used to create signal names, but may be utilized to provide names for other parts of the design.

The present invention also includes a process that allows a user to copy and paste signal names across individual or multiple cells. The paste special process (part of the auto naming class of functions) allows signal name(s) to be modified before being pasted. This is particularly useful when there is replicated functionality in a design, the user can add functionality once and then just does a copy followed by paste special.

Example name changes made before pasting the names to a new cell, for example, adding a prefix (e.g., adding SIG_ to each item being pasted). Table 5 illustrates an example paste special. Column 1 provides an example set of pin names that are copied and pasted using past special to a signal name column. The additional "SIG_" added to the copied signals was derived from the paste special command from a menu entry box or other entry mechanism specifying "SIG_" to be added to the copied items before pasting. The designer/user copies the pin names from column 1, (individually or as a group), and then pastes special (individually or as a group) indicating add prefix "SIG_." If done individually, a default value of the paste special uses the same parameters as the last paste special command, thus saving the designer user additional time re-specifying the paste special when naming (establishing connectivity of) related signal types.

TABLE 5

| Pin Name | Signal Name |
|---|---|
| CLK_100 | SIG_CLK_100 |
| INPUT_WAVE | SIG_INPUT_WAVE |
| OUTPUT_WAVE_150 | SIG_OUTPUT_WAVE_150 |

At step 440, any user inputs to the newly added or currently selected pin are checked. Checks performed include spelling, checks for duplicate names, port net width mismatch, pin type mismatch, etc. If any errors are uncovered, a short error message is displayed and example corrective action is also provided. If the user has more inputs, the process continues to either update existing pins, add new pins, or perform the same processes on a new or different block.

Figure 6:
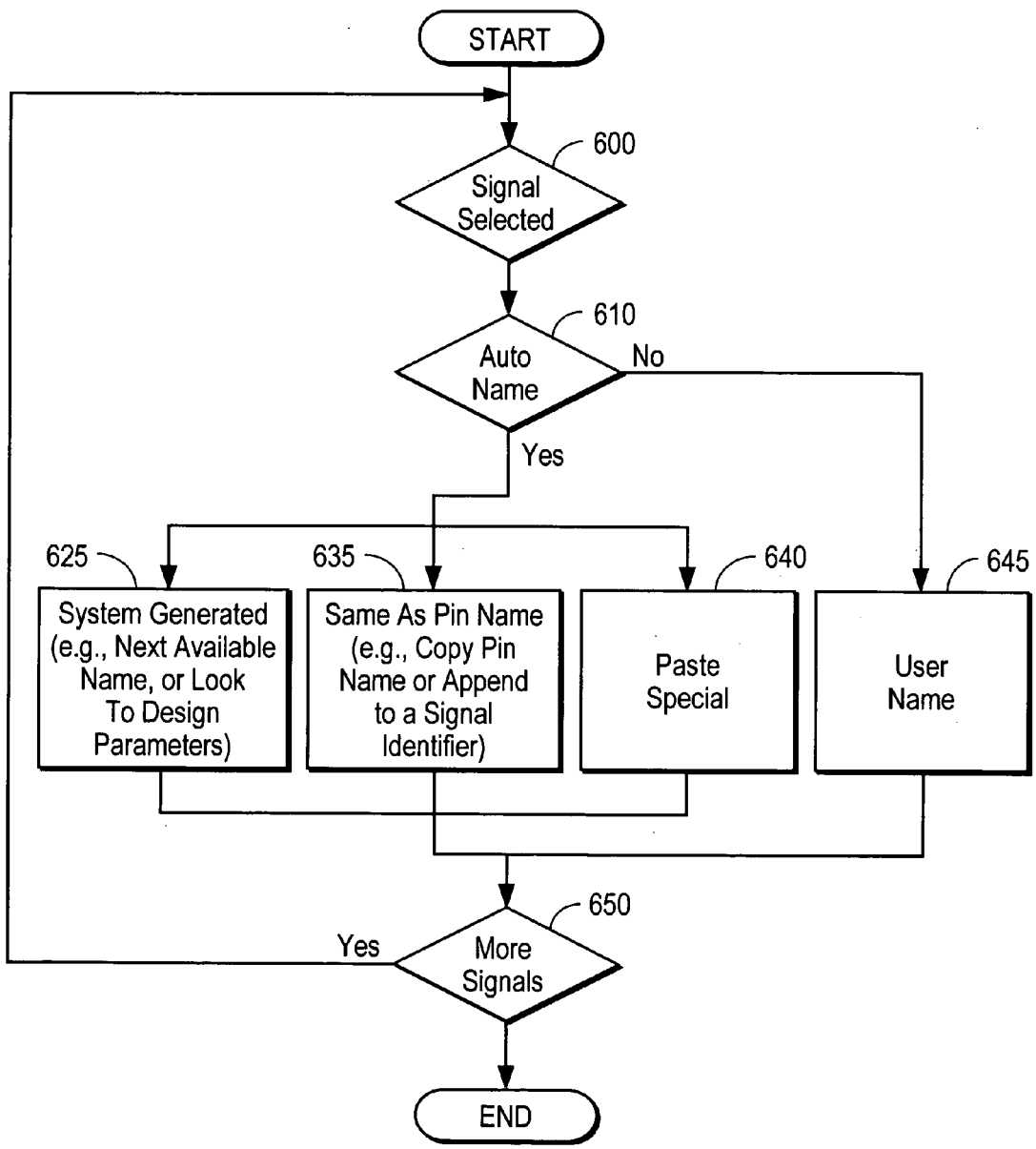
FIG. 6 is a flow chart of a signal naming process that adds connectivity to a design according to an embodiment of the present invention.

FIG. 6 is a flow chart of a signal naming process that adds connectivity to a design according to an embodiment of the present invention. At step 600, a component or block is selected. The user then selects a signal cell (step 610). The signal is selected, for example, by clicking on a signal cell in the detailed view 522 "Signal View".

If the user selects the System Generated button 534 then at step 625, the next available name whether calculated by sequential numbers or looking to other design parameters is calculated by the system generated naming process and placed in the selected signal cell. If the user selects the "Same As Pin Name" button 536, then the "Same As Pin Name" routine copies the Pin Name or copies the Pin Name and appends a signal identifier or index of some type to the Pin Name, and writes it to the selected signal cell (or the signal cell of a selected row) (step 635). The user may also invoke the paste special routine (e.g. clipboard contents are pasted into the selected cells with any paste special modifications made prior to pasting). If the user provides a name for the selected signal (step 645), then the user enters the name directly into the cell by clicking on the cell and then typing the user defined name into the selected cell. The process repeats for each additional signal (or other parameter) that the user names (step 650).

FIG. 7A is a screen shot of a user interface used by the system generated naming process according to an embodiment of the present invention. FIG. 7A illustrates a close-up of detail area 520. The user has selected the LOC_CNTL_TD0 Pin name 740 and pressed the System Generated button 534. The system generated naming process is invoked and provides signal_ 742 as the system generated signal name. In this example, using the sequential numbering scheme embodiment described above, the signal 742 is the first signal that has been system generated for this block in this design.

FIG. 7B is a screen shot of a user interface used by a "Same As Pin Name" naming process according to an embodiment of the present invention. Both the System Generated and "Same As Pin Name" processes may be invoked on multiple pins. In FIG. 7B, the user has selected multiple Pins 760. The user then presses the "Same As Pin Name" button 536. As a result, the signal names for each of the Pins highlighted are automatically assigned the same name as the Pin Name for each of the signal names in the same row as (corresponding to) the selected pin names. In one embodiment, the present invention includes facilities to use a copy/paste routine (and Paste Special) to copy Pin Names and directly paste those Pin Names into the signal cells. The routine may be used to copy/paste to/from a single block design or across different block designs. The paste special routine allows the designer/user to make name changes before pasting the names to a new cell.

FIG. 7C is a screen shot of a user interface used by a signal name process according to an embodiment of the present invention. In this embodiment, when naming signals, the user has the option of directly typing in a signal name to a selected cell, or pulling names from a drop down list box or other name selection mechanism. In FIG. 7A, the user has clicked in the signal cell 700 for the BOOTSCC_100M_CLK pin 700. A drop down box activator 715 appears, or was already visible. Pressing the drop down box activator 715 provides a list of possible signal names that may be clicked on for selection. The list of possible signals is any of the signals previously defined in the signal view, a set of predefined signals, and/or signals named in the component view in detailed view 520. When one of the signal names is selected, it appears in the signal cell 700. In this example design then, the selected signal is associated and, during simulation, routing, and layout, will be connected to the BOOTSCC_100M_CLK pin.

Additional features provided by the present invention include a "Merge Vector Bits" routine invoked by a "Merge Vector Bits" button 545. A design may have vector pins or signals (e.g., ADDR<64 . . . 0>). The user can see vector based signals as one row or they may be displayed in multiple rows.

Thus, the user can see the vector PCI_0_AD as PCI_0_AD<31> down to PCI_0_AD<0> or s/he can use merge bits and represent it as PCI_0_AD<31>, . . . PCI_0_AD<28 . . . 5> . . . PCI_0_AD<0>. For example, after entering the individual vectors PCI O AD<31> through PCI O AD<0>, the user selects the entered signals and presses "Merge Vector Bits" 545, creating the vector based signal PCI O AD<31 . . . 0>.

The "Merge Vector Bits" 545 option allows the user to create custom views of a multi-signal net name. This width and bits used in the custom view are defined by the user to automate similar connections to other instances in the design. As shown in FIG. 7D, the PCI 0 AD<31. . . 0>pin 779 is expanded to show its corresponding merged bits 780.

The "connect by" 550 process is used to connect pins. The user selects multiple pins spanning one instance or multiple instances and then select the System Generated button. In this example, a system generated signal is created that connects all of the selected pins. The user can also select a signal from the drop down box and the selected signal name will connect the pins. To select pins across instances user selects multiple components. The pins of the selected components will come into view in the lower pane but would be separated by splitters (or contained in other windows). This allows the user to distinguish the instance pins but still allow multiple pins to be connected together.

Figure 8:
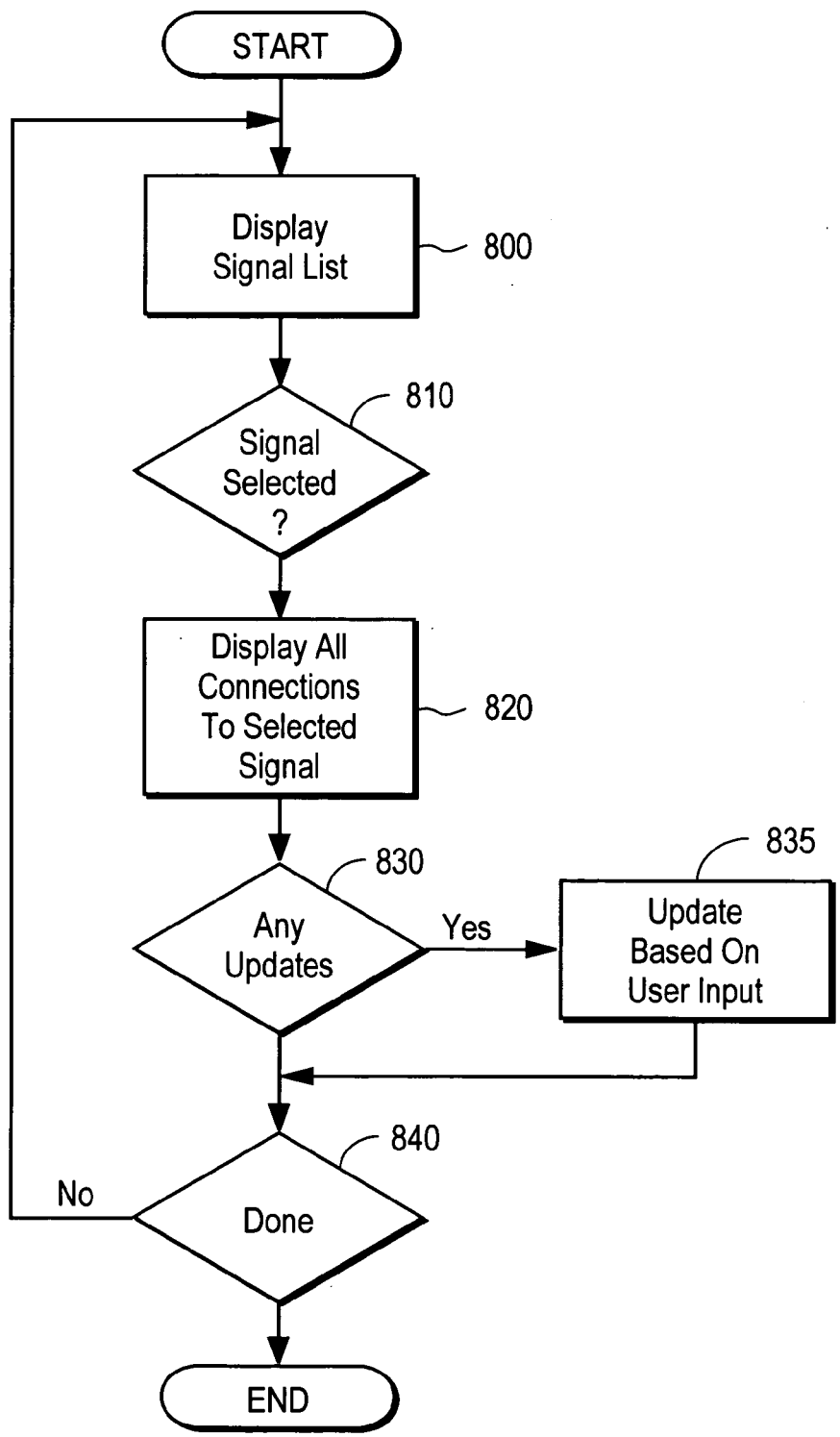
FIG. 8 is a flow chart of a signal view process according to an embodiment of the present invention.

The present invention also includes facilities to display signals and the various connections made to those signals in the design. FIG. 8 is a flow chart of a signal view and signal connection process according to an embodiment of the present invention. At step 800, a signal list is displayed. The displayed signal list is, for example, a signal view similar to that discussed earlier in FIG. 3.

FIG. 9 is a screen shot of a user interface used by a signal view and signal connection process according to an embodiment of the present invention. FIG. 9 includes a signal view 905 that displays a tabular, spreadsheet style, list of signal names 910, physical names 915, signal types 920, and other information 930. In this example, the physical names have not yet been filled out for each of the signals, and other information 930 is also available for more information input from the designer.

At step 810, a signal is selected. For example, in FIG. 9, the user clicks in the 3-3V signal name cell 940. And, at step 820, information about the selected signal, including all connections made to the selected signal is displayed in a detailed view 950. The detailed view identifies the signal name 955, cell 960, instance 965, and Pin Name 970. The signal name is the same (3-3V in this example) because that is the signal that is selected from the signal view 905 and all the connections, pins, etc. related to the selected signal are displayed. The combination of cell column 960 and the instance column 965 identifies a specific instance of a design cell, block, or component within the design where the signal is being used. The example instance names are in a format of pageX_iY where X and Y are schematic pages and handles. This will not be the naming scheme associated with instances added by the designer. Although some users may choose to use an automated naming scheme, i1, i2, i3, others will want to choose their own descriptive names. Examples: "CPU-MAIN", "LOWER_MEM". Both automated naming and user selected (user generated) naming is supported (user generated is when the user clicks on a cell and types in the name of the user's choosing). Pin Name 970 identifies a Pin to which the signal is connected. As with the other views discussed herein, the signal connections are preferably displayed in a tabular, spreadsheet style format including columns for different pieces of information about the signal block and/or design (depending on what view the designer is currently using). And again, information other that that specifically described in the provided examples may also be utilized in a similar tabular format by adding an additional column to any one or more of the views.

The present invention includes facilities to add connectivity to a selected signal. In one embodiment, the user adds new connectivity to the selected signal by clicking an add pin button (or drop down menu selection) (not shown). On doing this a new row would be added. The user can then select the cell name, instance name and pin name to be added to the signal. The added connectivity will also cause a corresponding change for the component whose pin was attached to this net. These changes may be viewed by opening the component view for the modified instance.

Figure 10:
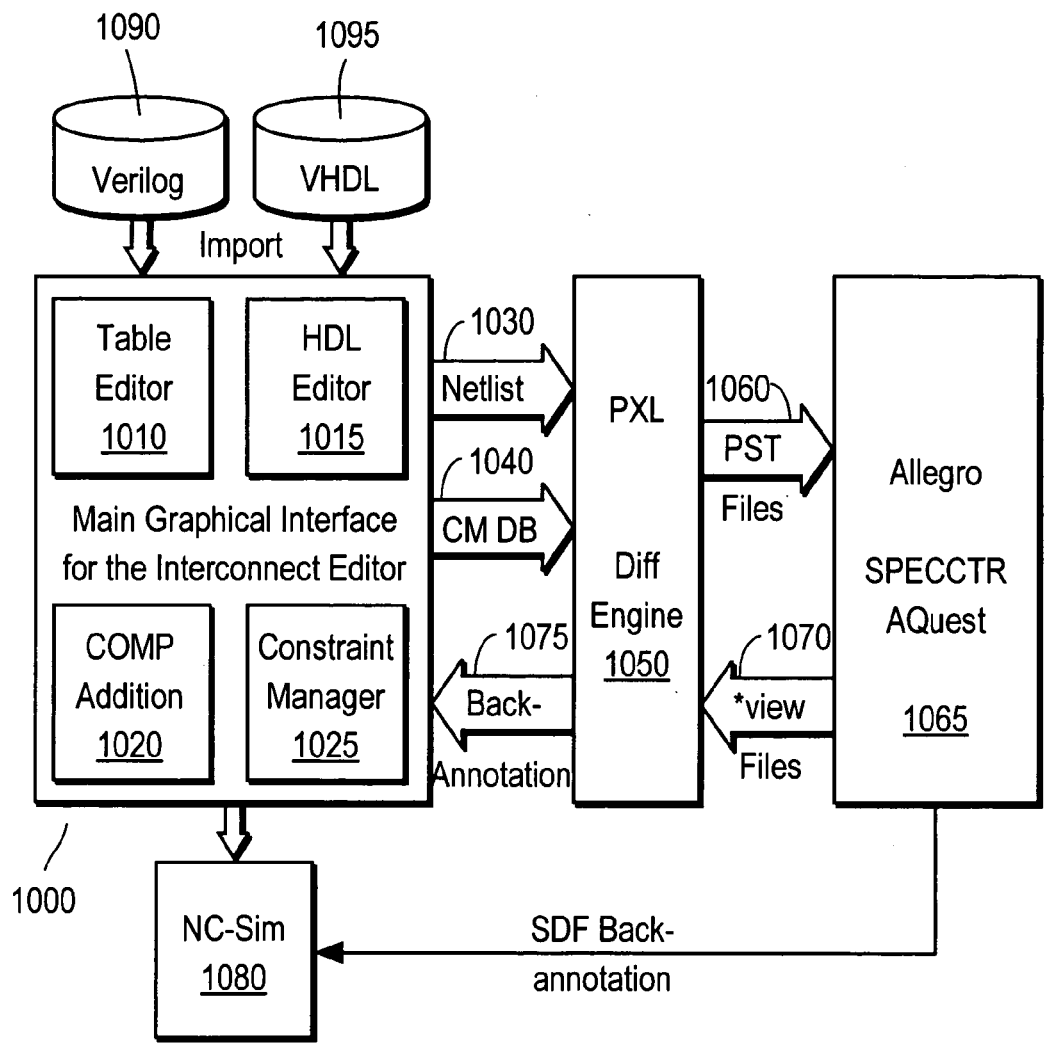
FIG. 10 is a block diagram of alternative design capture paradigms according to an embodiment of the present invention.

FIG. 10 is a block diagram of alternative design capture paradigms according to an embodiment of the present invention. The block diagram of FIG. 10 illustrates a functional flow of a design capture paradigm that is applicable to the present invention as described in its various alternative embodiments. A main graphical interface 1000 provides the core processing and facilities for entering and tracking signals, blocks, interconnections, and other information about the signals and blocks entered into the system. The main functional components of the graphical interface include a table editor 1010 that provides the spreadsheet-like capabilities of the system as illustrated in the various figures described herein. Although the present invention is a design entry system, it incorporates the organizational and display capabilities of a spreadsheet such as searching, sorting, and reordering of the information display, the same type of tools that are available in modern spreadsheet designs. However, it is important to note that these principles are being applied to designs and particularly to electronic designs having large pin count devices where the unique advantages discussed above can be taken full advantage of. Other tools within the main graphical interface 1000 include an HDL editor 1015 for Verilog™ and VHDL. This provides a language sensitive editor for these languages, and a user can enter connectivity in these languages using the editor. A component addition device 1020 provides facilities for adding any primitive component (e.g., integrated circuits, VLSI, FPGA, ASIC, etc.) or hierarchical module to the design. A constraint manager 1025 provides facilities for entering electrical constraints on nets. These constraints are used in routing and layout. Products of the present invention, including a netlist 1030 and database information (CM DB) 1040 is provided to a difference engine 1050 and PST files are transferred to a Cadence Allegro/SPECCTRAQuest tool for physical board layout and high-speed analysis. Output files such as *view Files 1070 are returned to the difference engine 1050 and back annotations 1075 are provided to the main graphical interface 1000.

The present invention also includes facilities to interface with a simulator 1080 that retrieves the signal and signal block and connection information from the entry system of the present invention along with SDF back annotations to perform simulations. And, as discussed above, the present invention also includes facilities for the direct import of Verilog™ files 1090 and VHDL data 1095.

Figure 11:
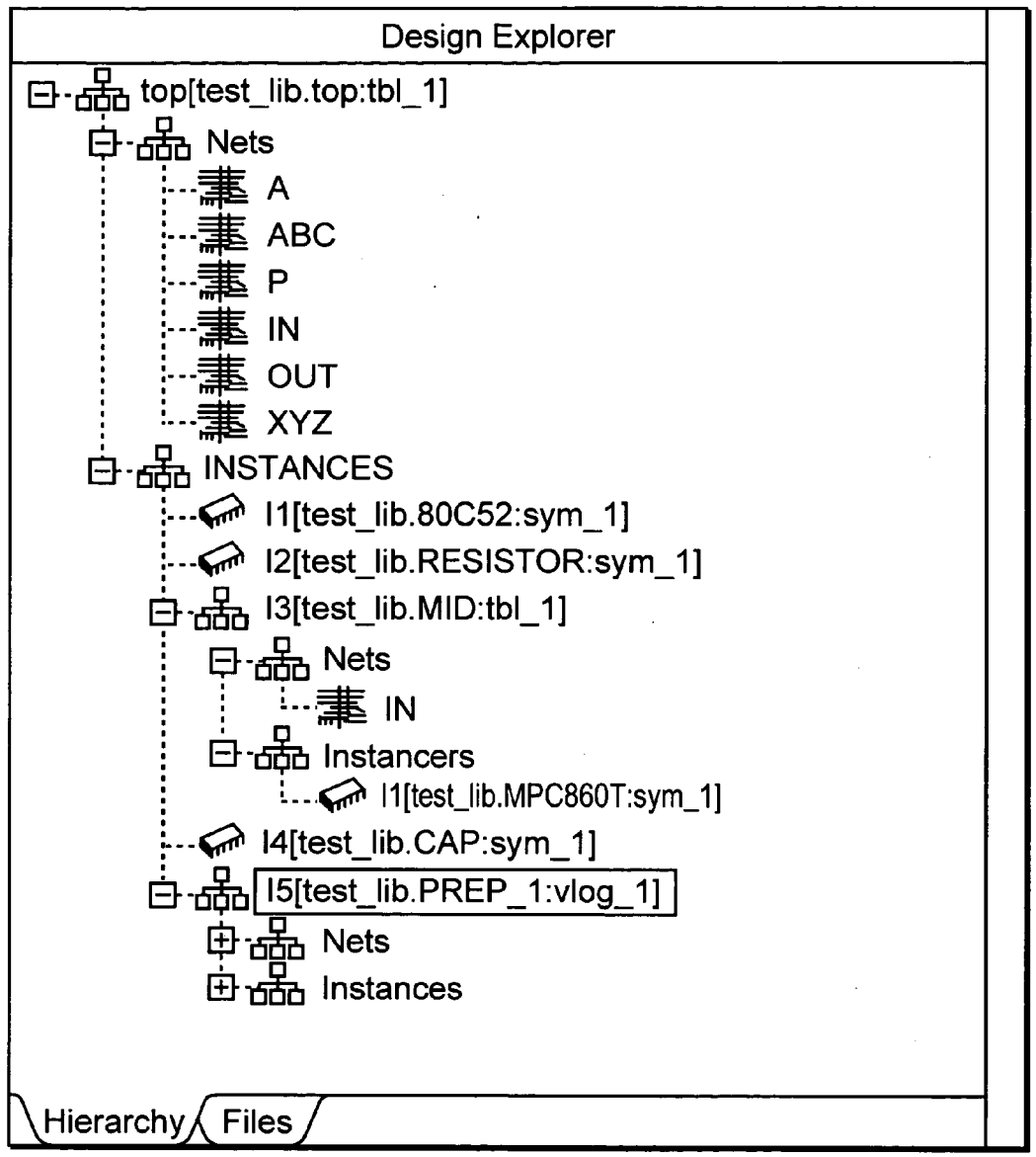
FIG. 11 is a hierarchy view of an example design tool that may be utilized in conjunction with an embodiment of the present invention.

FIG. 11 is a hierarchy view of an example design tool that may be utilized in conjunction with an embodiment of the present invention. The present invention includes facilities for interfacing with other design tools. For example, in FIG. 11, a screen shot from Cadence Design Explorer is shown. The Design Explorer provides a hierarchical breakdown of the design and the ability to parse the design to show local and global signals, and various component instances and bindings. In addition, Design Explorer also provides a file view that allows the designer to quickly review HDL files and configurations along with browsing the various logical components of the design. The interface between the present invention and Design Explorer comprises saving the data entered by the present invention to a format that is readable in Design Explorer and thus the invention can leverage the additional design view, file view, and logical component browsers already available in other state-of-the-art tools.

The present invention also includes facilities for high speed support, particularly in the area of terminations for the various signal lines. For example, in FIG. 7B, in the detail view of a selected component of the instance view, one of the pieces of information provided in the tabular display is termination 765. The termination column 765 allows the designer to enter a specific termination to be applied to a selected Pin (and hence any of the connected signals to that Pin). In FIG. 7B, the termination column 765 illustrates selection boxes (e.g., 770) which the user clicks on to display a list of available terminations. If a desired termination is not on the list displayed, the user, in one embodiment is provided the option of providing a custom termination design to be used, by importing a file having the data needed to implement the desired termination.

Figure 12:
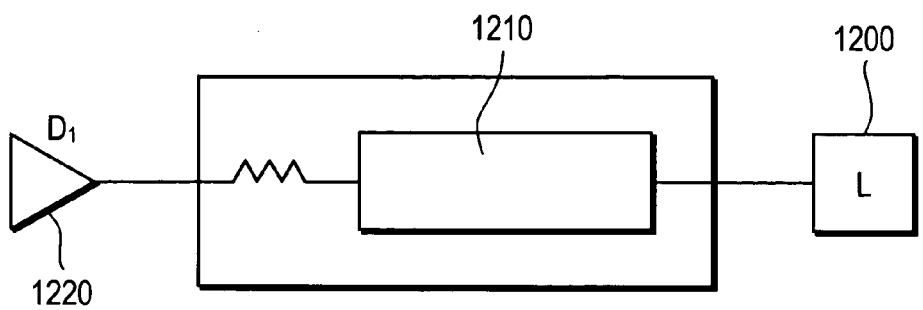
FIG. 12 is a circuit diagram of an example high speed termination utilized in conjunction with an embodiment of the present invention.

FIG. 12 is a circuit diagram of an example high speed termination utilized in conjunction with an embodiment of the present invention. FIG. 12 provides an example of a termination that may be available in an embodiment of the present invention, that termination being available for selection upon pressing the termination dropdown menu button 770, for example. The termination is illustrated as a schematic that includes a load 1200, at least one PC Board trace 1210, and at least one driver 1220. The schematic illustrates how an example termination would be connected to a net by identifying a specific set of criteria, including a driver, receiver, the termination components and a delay constraint.

The present invention includes facilities for a global update of various termination types, which is performed by changing a topology template defining those types. The constraint manager 1025 (e.g., see FIG. 10) performs various checks to make sure that the selected termination type is appropriate for the particular net, or Pin within a net to which the termination being connected.

Figure 13:
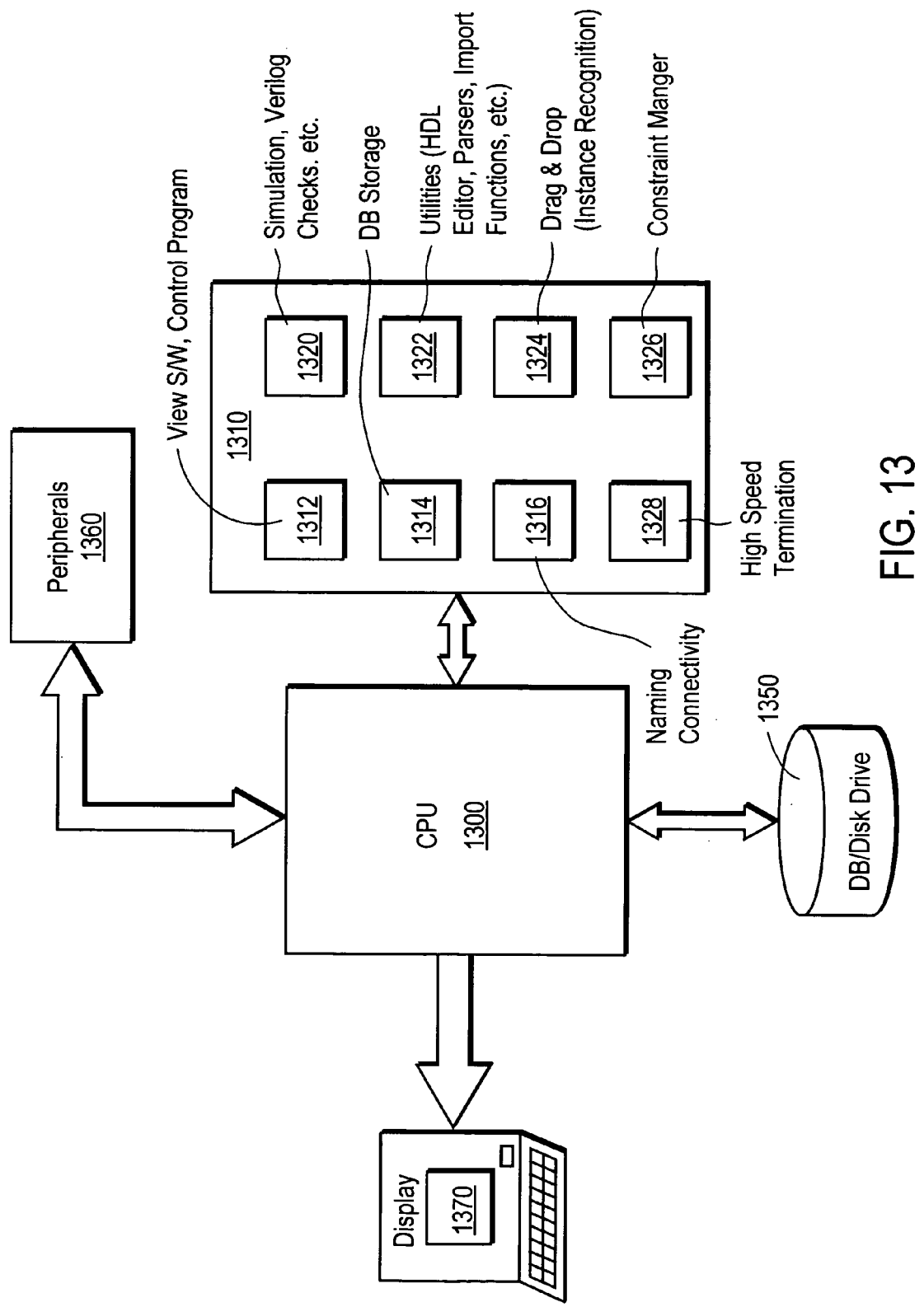
FIG. 13 is a block diagram of high level components configured to implement an embodiment of the present invention.

In one embodiment, the present invention is a computer program having various components to implement the processes described above. FIG. 13 is a block diagram of high level components configured to implement an embodiment of the present invention. A CPU 1300, which can be any of the various processing devices available in today's market, including the microprocessor, mainframe, or network computer, executed programs stored in memory 1310 that include, for example, a control program 1312 that displays the various views (e.g., signal view, instance view, etc.) and manages other programs such as database storage programs 1314, naming and connectivity 1316, high speed termination selection 1318, utilities 1322, including, for example, HDL editor, parsers, import functions, etc., drag and drop implementation 1324 that allows the user to drop files having various blocks or other signal definitions into a design, and a constraint manager 1326. Memory 1310 also includes at least portions of an operating system 1328 and other outside routines 1320 (e.g., simulation, Verilog™ checks, etc.) that may be utilized by the present invention. Database/disk drive 1350 provides persistent storage of designs, data, and other programs utilized by the present invention. Peripherals 1360 allow the present invention to access other devices, network communications, etc. And, a display 1730 allows the control program 1312 to have an output in which the user can visually examine and interact with the design.

Although the present invention has been described herein with reference to electronic circuits, mainly ICs, IC pins and signals connecting the pins, the devices and processes of the present invention may be applied to other areas, including network design and management, including computer networks, power grids, etc.

In describing preferred embodiments of the present invention illustrated in the drawings, specific terminology is employed for the sake of clarity. However, the present invention is not intended to be limited to the specific terminology so selected, and it is to be understood that each specific element includes all technical equivalents which operate in a similar manner. For example, when describing a tabular formatted or spreadsheet style display, any other equivalent device, such as a table listing, or window for each signal, or other display having an equivalent function or capability, whether or not listed herein, may be substituted therewith. Furthermore, the inventors recognize that newly developed technologies not now known may also be substituted for the described parts and still not depart from the scope of the present invention. All other described items, including, but not limited to drop down menus, selection techniques, display orders processing orders, buttons, boxes, etc should also be consider in light of any and all available equivalents.

Portions of the present invention may be conveniently implemented using a conventional general purpose or a specialized digital computer or microprocessor programmed according to the teachings of the present disclosure, as will be apparent to those skilled in the computer art.

Appropriate software coding can readily be prepared by skilled programmers based on the teachings of the present disclosure, as will be apparent to those skilled in the software art. The invention may also be implemented by the preparation of application specific integrated circuits or by interconnecting an appropriate network of conventional component circuits, as will be readily apparent to those skilled in the art based on the present disclosure.

The present invention includes a computer program product which is a storage medium (media) having instructions stored thereon/in which can be used to control, or cause, a computer to perform any of the processes of the present invention. The storage medium can include, but is not limited to, any type of disk including floppy disks, mini disks (MD's), optical discs, DVD, CD-ROMS, micro-drive, and magneto-optical disks, ROMs, RAMS, EPROMs, EEPROMS, DRAMs, VRAMs, flash memory devices (including flash cards), magnetic or optical cards, nanosystems (including molecular memory ICs), RAID devices, remote data storage/archive/warehousing, or any type of media or device suitable for storing instructions and/or data.

Stored on any one of the computer readable medium (media), the present invention includes software for controlling both the hardware of the general purpose/specialized computer or microprocessor, and for enabling the computer or microprocessor to interact with a human user or other mechanism utilizing the results of the present invention. Such software may include, but is not limited to, device drivers, operating systems, and user applications. Data used by the software may be retrieved from different sources (local or remote) and either permanently or temporarily stored (before, during, or after any processing) by utilizing any of text files, delimited files, database(s), or other storage techniques. Ultimately, such computer readable media further includes software for performing the present invention, as described above.

Included in the programming (software) of the general/specialized computer or microprocessor are software modules for implementing the teachings of the present invention, including, but not limited to, retrieving signal names, components and related parameters, importing packages, exporting packages, syntax checking, displaying signal and instance views of designs, forwarding data to other processes, and the display, storage, or communication of results according to the processes of the present invention.

Obviously, numerous modifications and variations of the present invention are possible in light of the above teachings. It is therefore to be understood that within the scope of the appended claims, the invention may be practiced otherwise than as specifically described herein.

What is claimed and desired to be secured by Letters Patent of the United States is:

1. A table based design entry system, comprising:
  a component entry device configured to retrieve user entries of a component to be used in a design;
  a component display mechanism configured to display the entered components in a table based form wherein individual components may be selected; and
  a signal display view configured to display signals in a table based form for a selected component;
  wherein:
  the signal display view table based form comprises a listing of each pin of the selected component, a mechanism for selecting a pin, and a drop down menu that includes a selection of signals available to apply to the selected pin;
  the selection of signals include a selection of terminations available to be applied to the selected pin; and
  upon selection of one of the signals from the drop down menu, the selected signal is included in the signal display view.

2. The table based design entry system according to claim 1, wherein:
  the signal display view table based form comprises a row for each pin and a signal column; and
  the drop down menu comprises a menu initiating link located in a cell defined by a pin row and the signal column.

3. The table based design entry system according to claim 1, further comprising:
  a signal entry mechanism configured to retrieve a set of signals available for use in the design.

4. The table based design entry system according to claim 3, wherein the set of signals available for use in the design include a set of signals read into the table based design entry system from a file and displayed in a table based listing of signal types including identification of Signal Type, Signal Name, Verilog Signal Type, and VHDL Signal Type.

5. The table based design entry system according to claim 4, wherein the table based listing of signal types comprises at least one drop down menu invoked from a Signal Type cell in the table based listing of signal types and configured to make an alternative Signal Type selection.

6. The table based design entry system according to claim 1 further comprising a drag and drop component configured to allow selection of a file containing pre-defined signal names to be added to the table based design entry system.

7. The table based design entry system according to claim 1 further comprising a syntax check mechanism configured to check design syntax prior to simulation.

8. The table based design entry system according to claim 7 wherein the syntax check comprises a port and signal width mismatch check.

9. The table based design entry system according to claim 7 wherein the simulation comprises processing performed by software resident on a same platform hosting the design entry system.

10. The table based design entry system according to claim 1 further comprising a set-up screen configured to allow entry of a set of predefined signal types to set-up the table based entry system.

11. A table based design entry system for electronic designs, comprising:
  a component display mechanism configured to display components of the design in a tabular form wherein individual components may be selected; and
  a signal display device configured to display pins of a selected component in a table of cells including, for each pin, Pin Identification, Signal, and Terminations;
  wherein:
  the signal display device comprises at least one selection menu invoked directly from a cell corresponding to one of Signal and Terminations.

12. The table based design entry system according to claim 11, wherein the at least one selection menu comprises a termination selection menu configured to allow user selection of a termination for a pin.

13. The table based design entry system according to claim 12, wherein the at least one selection menu comprises a plurality of termination selection menus each individually invoked directly from individual termination cells and each configured to provide a selection of terminations, including a high speed termination, available for selection for a pin corresponding to a termination cell in which the termination selection menu was invoked.

14. The table based design entry system according to claim 11, wherein the at least one selection menu comprises a signal selection menu invoked from one of the Signal cells and configured to select a Signal to be applied to a pin corresponding to the Signal cell.

* * * * *